(12) United States Patent
Cheng et al.

(10) Patent No.: US 7,359,002 B2
(45) Date of Patent: Apr. 15, 2008

(54) CAMERA MODULE AND METHOD FOR PACKAGING THE SAME

(75) Inventors: Kuang-Chih Cheng, Linnei Township, Yunlin County (TW); Cheng-Kuang Sun, Hsinchu (TW); Kuang-Hsing Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 861 days.

(21) Appl. No.: 10/739,635

(22) Filed: Dec. 17, 2003

(65) Prior Publication Data

US 2005/0117051 A1 Jun. 2, 2005

(30) Foreign Application Priority Data

Nov. 28, 2003 (TW) .............................. 92133508 A

(51) Int. Cl.
*H04N 5/225* (2006.01)
(52) U.S. Cl. ...................................... 348/374
(58) Field of Classification Search ................. 348/374
See application file for complete search history.

(56) References Cited

U.S. PATENT DOCUMENTS 5,221,964 A * 6/1993 Chamberlain et al. ...... 348/373
5,731,834 A * 3/1998 Huot et al. .................. 348/374
6,370,339 B1 * 4/2002 Stern et al. .................. 396/429
6,427,078 B1 * 7/2002 Wilska et al. ............. 455/550.1
2005/0024752 A1 * 2/2005 Webster ...................... 359/819
2006/0267169 A1 * 11/2006 Bolken et al. .............. 257/678

OTHER PUBLICATIONS

Eric R. Fossum, 1995, IEEE, "CMOS Image Sensors: Electronic Camera On A Chip", pp. 1.3.1-1.3.9.*

* cited by examiner

*Primary Examiner*—Tuan Ho
*Assistant Examiner*—Anthony J Daniels
(74) *Attorney, Agent, or Firm*—J.C. Patents

(57) ABSTRACT

A camera module is provided. The camera module comprises: a holder having an upper portion, a lower portion, and a bottom; a lens member held on the upper portion of the holder; a hinge disposed on the bottom of the holder; a cover coupled to the hinge and to the bottom of the holder, the cover being allowed to open and close to cover the bottom of the holder, the cover and the lower portion of the holder forming a space; and an image sensing and processing device disposed on the cover, wherein when the cover is close, the space can accommodate the image sensing and processing device.

16 Claims, 4 Drawing Sheets

CAMERA MODULE AND METHOD FOR PACKAGING THE SAME

CROSS-REFERENCE TO RELATED APPLICATION

This application claims the priority benefit of Taiwan application serial no. 92133508, filed on Nov. 28, 2003, the full disclosure of which is incorporated herein by reference.

BACKGROUND OF THE INVENTION

1. Field of the Invention

This invention generally relates to a camera module, and more particularly to a packaging structure of a camera module allowing the image sensing device to be removed from or inserted into a holder for a camera module.

2. Description of Related Art

Cameras, such as digital cameras, have been widely used in our daily life. Because more and more customers are purchasing the digital cameras, how to simplify the packaging process is an important issue for mass production.

The cost and quality of the digital cameras partially depend on the structure and method of packaging. FIG. 1 is a traditional camera module. As shown in FIG. 1, a traditional camera module includes a holder 100 to hold a lens member 102 on its upper portion. The holder 100 also has a lower portion. There is an image sensing device 106 such as a CMOS image sensing device on the printed circuit board (PCB) 104 and inside the lower portion of the holder 100. CMOS image sensing device 106 is connected to the PCB 104 via the conducting line 108 by wire bonding. The holder 100 is fixed on the PCB 104 via a fixing member 112. If the PCB is a flexible PCB, then a hard board 110 can be disposed on the other side of the flexible PCB corresponding to the image sensing device 106 in order to enhance the mechanical strength.

FIG. 2 is another traditional camera module packaging. The difference between FIGS. 1 and 2 is that the holder 100 is directly disposed on the image sensing device 200 to electrically connect the flexible PCB 202.

The above digital camera packaging structures at least have the following drawbacks. When the packaging process is finished, it is difficult to dissemble. If after packaging one finds that the camera module does not work well, especially when it is necessary to adjust or change the image sensing device, it takes long time to dissemble. Further, the particles or dust are easy to fall to the surface of the image sensing device and are difficult to detect. This problem probably would not be detected until the packaging process has been finished. To dissemble the module for cleaning or change the image sensing device would take time and increase the packing costs.

SUMMARY OF THE INVENTION

An object of the present invention is to provide a camera module allowing the image sensing device to be removed from or inserted into the camera module from the holder.

The present invention provides a camera module, comprising: a holder having an upper portion and a lower portion, and a bottom; a lens member held on the upper portion of the holder; a cover covering the bottom of the holder, the cover and the lower portion of the holder forming a drawer-like space; and an image sensing and processing device disposed inside the drawer-like space by a drawer mechanism.

The present invention provides a camera module, comprising: a holder having an upper portion, a lower portion, and a bottom; a lens member held on the upper portion of the holder; a hinge disposed on the bottom of the holder; a cover coupled to the hinge and to the bottom of the holder, the cover being allowed to open and close to cover the bottom of the holder, the cover and the lower portion of the holder forming a space; and an image sensing and processing device disposed on the cover, wherein when the cover is close, the space can accommodate the image sensing and processing device.

The present invention provides a method for packaging a camera module, comprising: providing a holder having an upper portion, a lower portion, and a bottom; assembling a lens member on the upper portion of the holder; assembling a cover to cover the bottom of the holder, the cover and the lower portion of the holder forming a drawer-like space; and assembling an image sensing and processing device into the drawer-like space by a drawer mechanism.

The present invention provides a method for packaging a camera module, comprising: providing a holder having an upper portion, a lower portion, and a bottom; assembling a lens member on the upper portion of the holder; assembling an image sensing and processing device on a cover; and covering the cover on the bottom of the holder, the cover and the lower portion of the holder forming a space to accommodate the image sensing and processing device. In a preferred embodiment of the present invention, the method further comprises using a hinge to couple the cover and the bottom of the holder, the cover being allowed to open and close to cover the bottom of the holder.

The present invention is not limited to the use of the hinge. In fact, the cover is not necessary to be coupled to the holder 400. It only requires that the image sensing device 402 is fixed on the cover 406 and then the holder 400 is covered by the cover 406.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 1:
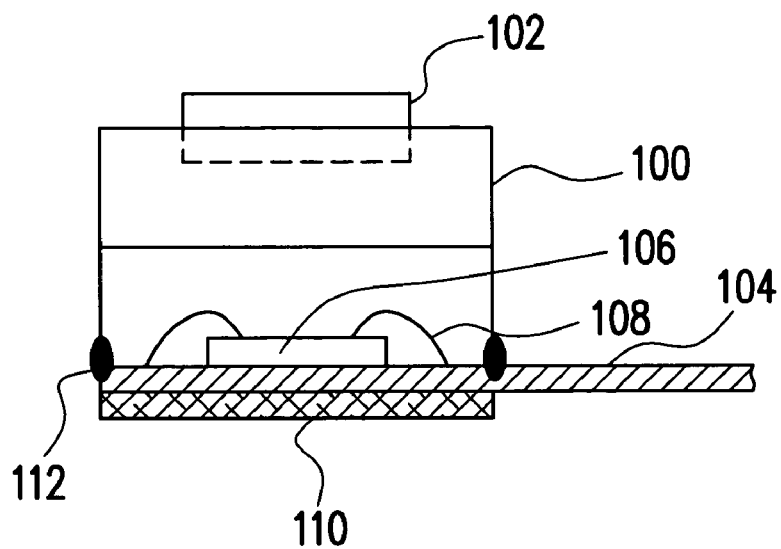
FIG. 1 is a traditional camera module.
Figure 2:
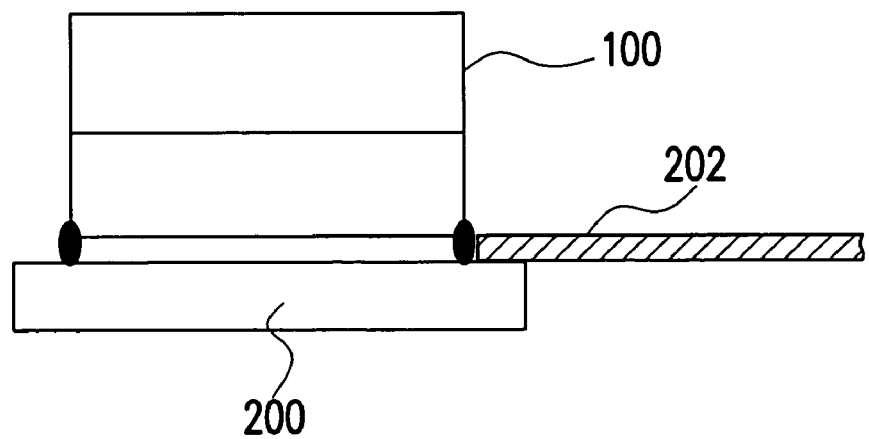
FIG. 2 is another traditional camera module.
Figure 3A:
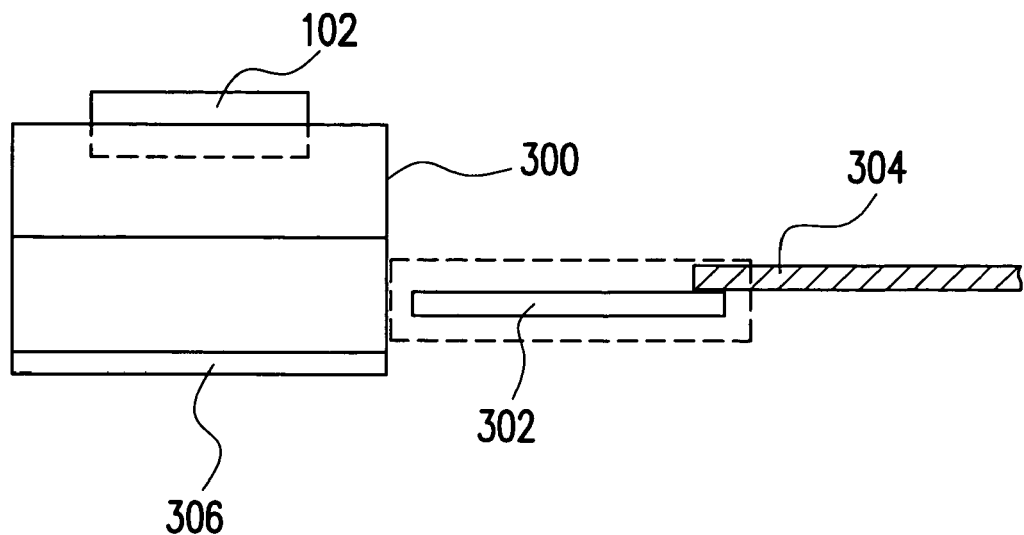
FIGS. 3A-3C show the process for packaging the camera module in accordance with a preferred embodiment of the present invention.
Figure 3B:
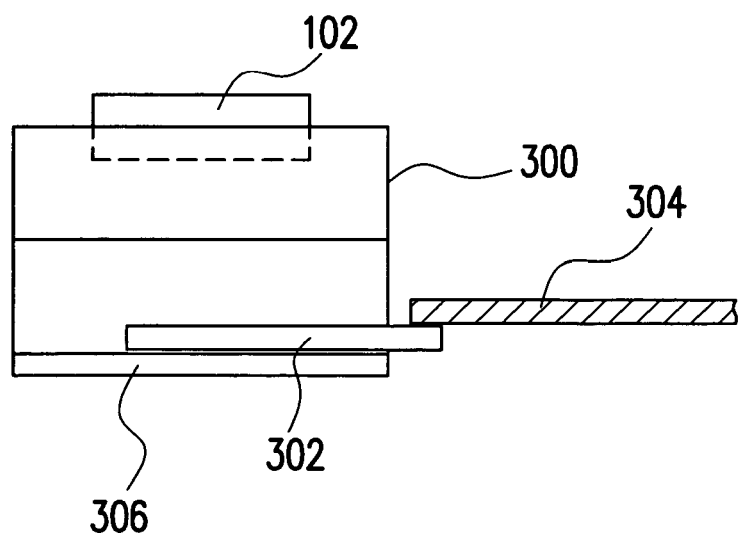
Figure 3C:
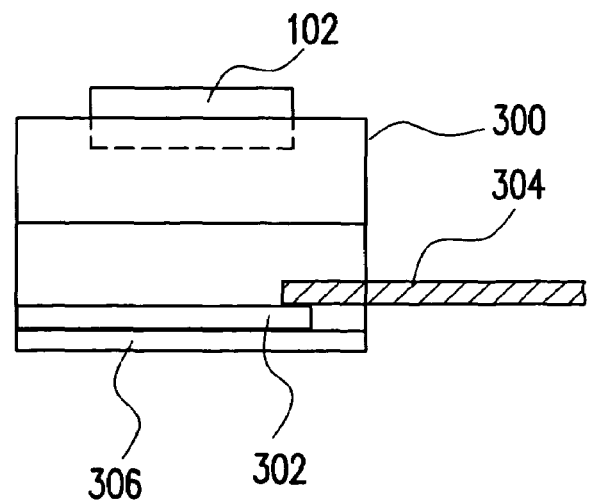

FIGS. 3A-3C show the process for packaging the camera module in accordance with a preferred embodiment of the present invention. Referring to FIG. 3A, a holder 300 has an upper portion and a lower portion. A lens member 102 is held on the upper portion of the holder 300. A cover 306 covers the bottom of the holder 300. The cover 306 and the lower portion of the holder 300 forms a drawer-like space, which is designed with a draw mechanism. Further, an image sensing and processing device 302 can be pre-assembled on a circuit board 304. The image sensing and processing device 302 includes an image sensing device and a signal processing device stacked and electrically connected together. A glass layer can also be stacked on the image sensing and processing device 302. The image sensing and processing device 302 is electrically connected to the circuit board 304. The circuit board 304 can be an inflexible PCB or a flexible PCB. The image sensing and processing device 302 and the circuit board 304 can be pre-packaged.

Referring to FIG. 3B, the pre-packaged image sensing and processing device 302 can be disposed by a drawer mechanism on the cover 306 that is disposed on the bottom of the holder. Referring to FIG. 3C, the image sensing and processing device 302 is disposed on the predetermined position of the cover 306.

For practical design purpose, there are some components between the image sensing and processing device 302 and the cover 306. Those components not shown in the figures can be implemented by conventional methods which will not be described here. The present invention focuses on the fact that the pre-assembled image sensing and processing device 302 can be easily disposed on or removed from the cover 306 at any time.

The packaging process of the present invention allows that the image sensing and processing device 302 be pre-assembled. Because the surface of the image sensing and processing device 302 is easily to attach dirt or particles, which may affect the performance of the image sensing and processing device 302. Hence, the present invention allows easily removing the image sensing and processing device 302 for cleaning or changing. Further, it also allows the users to easily insert and remove the image sensing and processing device 302 without sending the camera module back to the manufacturer.

Figure 4A:
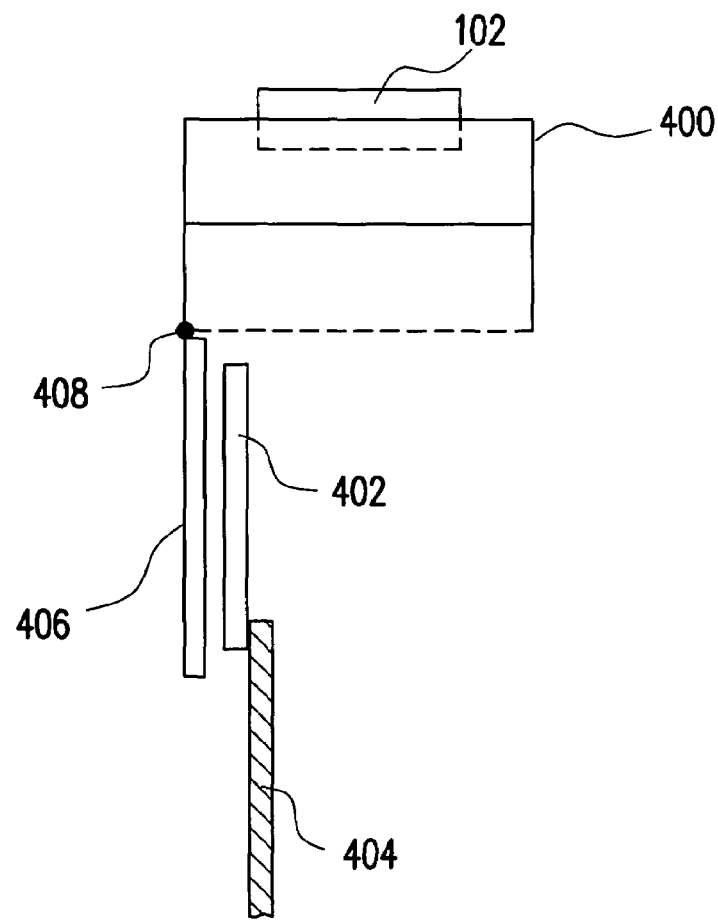
FIGS. 4A-4C show the process for packaging the camera module in accordance with another preferred embodiment of the present invention.
Figure 4B:
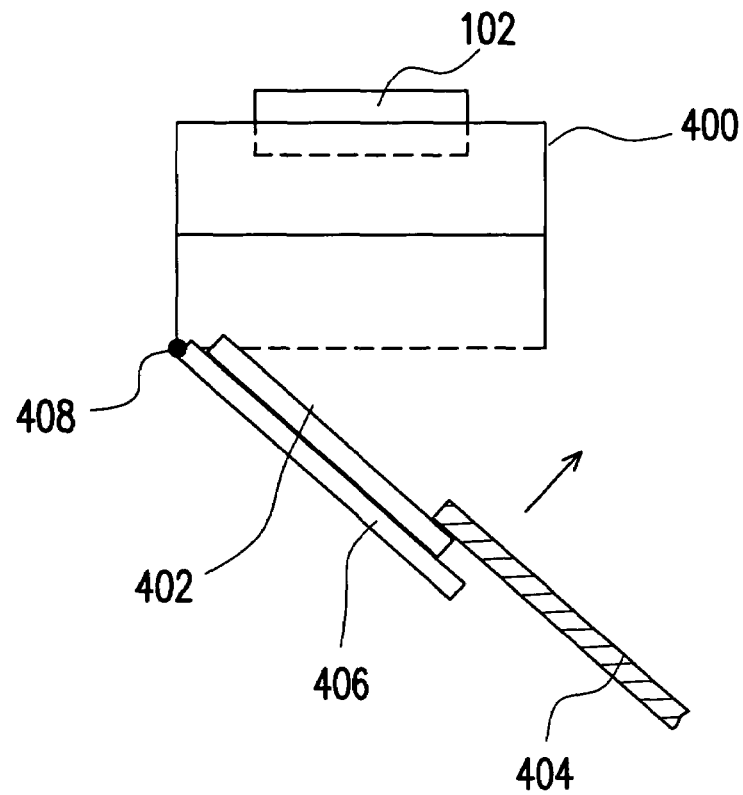
Figure 4C:
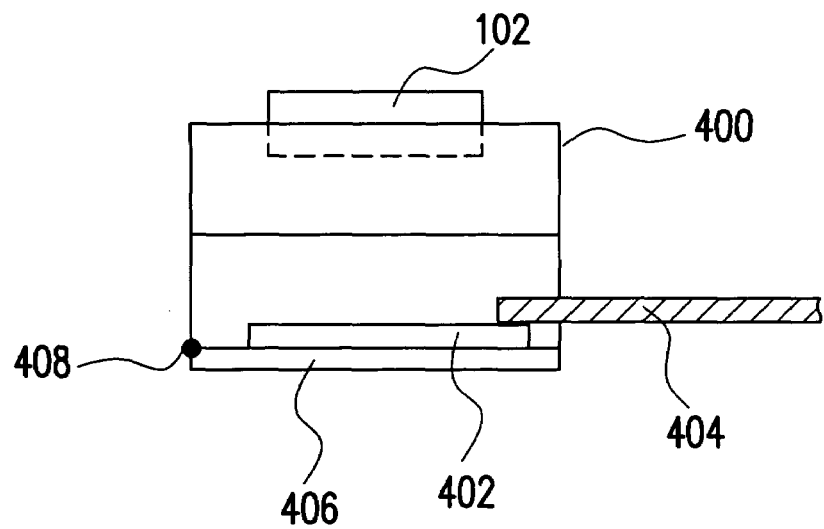

FIGS. 4A-4C show the process for packaging the camera module in accordance with another preferred embodiment of the present invention. Referring to FIG. 4A, a holder 400 has an upper portion, a lower portion. A lens member 102 is held on the upper portion of the holder 400. The cover 406 is coupled to the bottom of the holder 400 via a hinge 408. Therefore, the cover 406 is allowed to open and close the bottom of the holder 400. When the cover 406 is close, there are also some traditional ways to make the cover firmly cover the holder 400, which should be known to one skilled in the art.

Referring to FIG. 4B, when the image sensing and processing device 402 is fixed on the cover 406, the cover 406 can be moved upward to close. Referring to FIG. 4C, when the image sensing and processing device is fixed on the cover 406, the cover 406 is closed at the bottom of the holder. In this structure, if the user only wants to clean the surface of the image sensing and processing device, it is not required to move the image sensing and processing device from the cover 406.

Further, the application of the hinge 408 is only an embodiment of the present invention. In fact, the cover 406 does not have to be coupled to the holder 400. It is within the scope of the present invention once the image sensing and processing device 402 can be fixed on the cover 406 and then the cover 406 can cover the holder 400.

Therefore, the present invention provides a camera module allowing the image sensing and processing device to be easily removed from or inserted into the holder. When the image sensing and processing device is required to be cleaned or changed, the image sensing and processing device can be easily removed from or inserted into the holder.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A camera module, comprising:
   a holder having an upper portion and a lower portion, and a bottom;
   a lens member held on said upper portion of said holder;
   a cover covering said bottom of said holder, wherein a compartment is confined by said cover and said lower portion of said holder; and
   an image sensing and processing device disposed inside said compartment, wherein said image sensing and processing device is removable from said compartment by a drawer mechanism and the drawer mechanism allows said image sensing and processing device to be pushed into and pulled out of said compartment.

2. The camera module of claim 1, farther comprising a circuit board electrically connected to said image sensing and processing device.

3. The camera module of claim 2, wherein said circuit board is an inflexible printed circuit board.

4. The camera module of claim 2, wherein said circuit board is a flexible printed circuit board.

5. The camera module of claim 1, wherein said image sensing and processing device includes an image sensing device.

6. The camera module of claim 5, wherein said image sensing and processing device includes a signal processing device stacked on and electrically connected to said image sensing device.

7. The camera module of claim 5, wherein said image sensing and processing device includes a glass layer stacked on said image sensing device.

8. The camera module of claim 5, wherein said image sensing device is a CMOS image sensing device.

9. A method for packaging a camera module, comprising:
   providing a holder having an upper portion, a lower portion, and a bottom;
   assembling a lens member on said upper portion of said holder;
   assembling a cover to cover said bottom of said holder, wherein a compartment is confined by said cover and said lower portion of said holder; and
   pushing an image sensing and processing device into said compartment by a drawer mechanism, wherein said image sensing and processing device is removable from said compartment and the drawer mechanism allows said image sensing and processing device to be pushed into and pulled out of said compartment.

10. The method of claim 9, further comprising connecting a circuit board to said image sensing and processing device before pushing said image sensing and processing device into said compartment.

11. The method of claim 10, wherein said circuit board is an inflexible printed circuit board.

12. The method of claim 10, wherein said circuit board is a flexible printed circuit board.

13. The method of claim 9, wherein said image sensing and processing device includes an image sensing device.

14. The method of claim 13, wherein said image sensing and processing device includes a signal processing device stacked on and electrically connected to said image sensing device.

15. The method of claim 13, wherein said image sensing and processing device includes a glass layer stacked on said image sensing device.

16. The method of claim 13, wherein said image sensing device is a CMOS image sensing device.

* * * * *